(12) United States Patent
Huang et al.

(10) Patent No.: US 10,509,420 B2
(45) Date of Patent: Dec. 17, 2019

(54) RETICLE PURGING SYSTEM AND METHOD THEREOF

(71) Applicant: TAIWAN SEMICONDUCTOR MANUFACTURING CO., LTD., Hsinchu (TW)

(72) Inventors: Chun-Jung Huang, Yunlin County (TW); Yu-Yao Huang, Taichung (TW); Shih-Ming Chin, Nantou County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 38 days.

(21) Appl. No.: 15/207,740

(22) Filed: Jul. 12, 2016

(65) Prior Publication Data

US 2018/0019146 A1   Jan. 18, 2018

(51) Int. Cl.
*H01L 21/677* (2006.01)
*G05D 7/06* (2006.01)
*H01L 21/67* (2006.01)
*H01L 21/673* (2006.01)

(52) U.S. Cl.
CPC ..... *G05D 7/0617* (2013.01); *H01L 21/67259* (2013.01); *H01L 21/67359* (2013.01); *H01L 21/67721* (2013.01)

(58) Field of Classification Search
None
See application file for complete search history.

(56) References Cited

U.S. PATENT DOCUMENTS

| | | | | |
|---|---|---|---|---|
| 5,972,727 | A * | 10/1999 | Ryan | G03F 7/70541 250/548 |
| 6,403,905 | B1 * | 6/2002 | Conboy | G03F 7/70741 209/563 |
| 6,848,876 | B2 * | 2/2005 | Babbs | B65G 1/045 414/217.1 |
| 9,589,825 | B2 * | 3/2017 | Sun | H01L 21/6838 |
| 2016/0068425 | A1 * | 3/2016 | Sun | F27D 3/0084 414/153 |
| 2017/0212057 | A1 * | 7/2017 | Janik | G01N 21/94 |

* cited by examiner

*Primary Examiner* — Mark C Hageman
(74) *Attorney, Agent, or Firm* — McClure, Qualey & Rodack, LLP

(57) ABSTRACT

A reticle purging system includes an automated pod opener, a reticle holding device, a reticle transporting device and at least one purging device. The reticle holding device has a reticle occupiable zone thereon. The reticle transporting device is assigned with a transportation path from the automated pod opener to the reticle holding device. The reticle occupiable zone is exposed to the purging device.

20 Claims, 7 Drawing Sheets

Fig. 3

RETICLE PURGING SYSTEM AND METHOD THEREOF

BACKGROUND

An integrated circuit is formed by first generating an integrated circuit (IC) design that describes a physical layout of an integrated circuit on a computer. A reticle is then formed from the IC design. The reticle is used during IC fabrication to pattern a semiconductor substrate to form on-chip structures that correspond to the IC design. The reticle is usually inspected and purged for photomask defects or undesirable particles manually before being used to replicate mask images on semiconductor substrates used in products.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 7 illustrate a reticle purging method at various stages in accordance with some embodiments.

DETAILED DESCRIPTION

Figure 1:
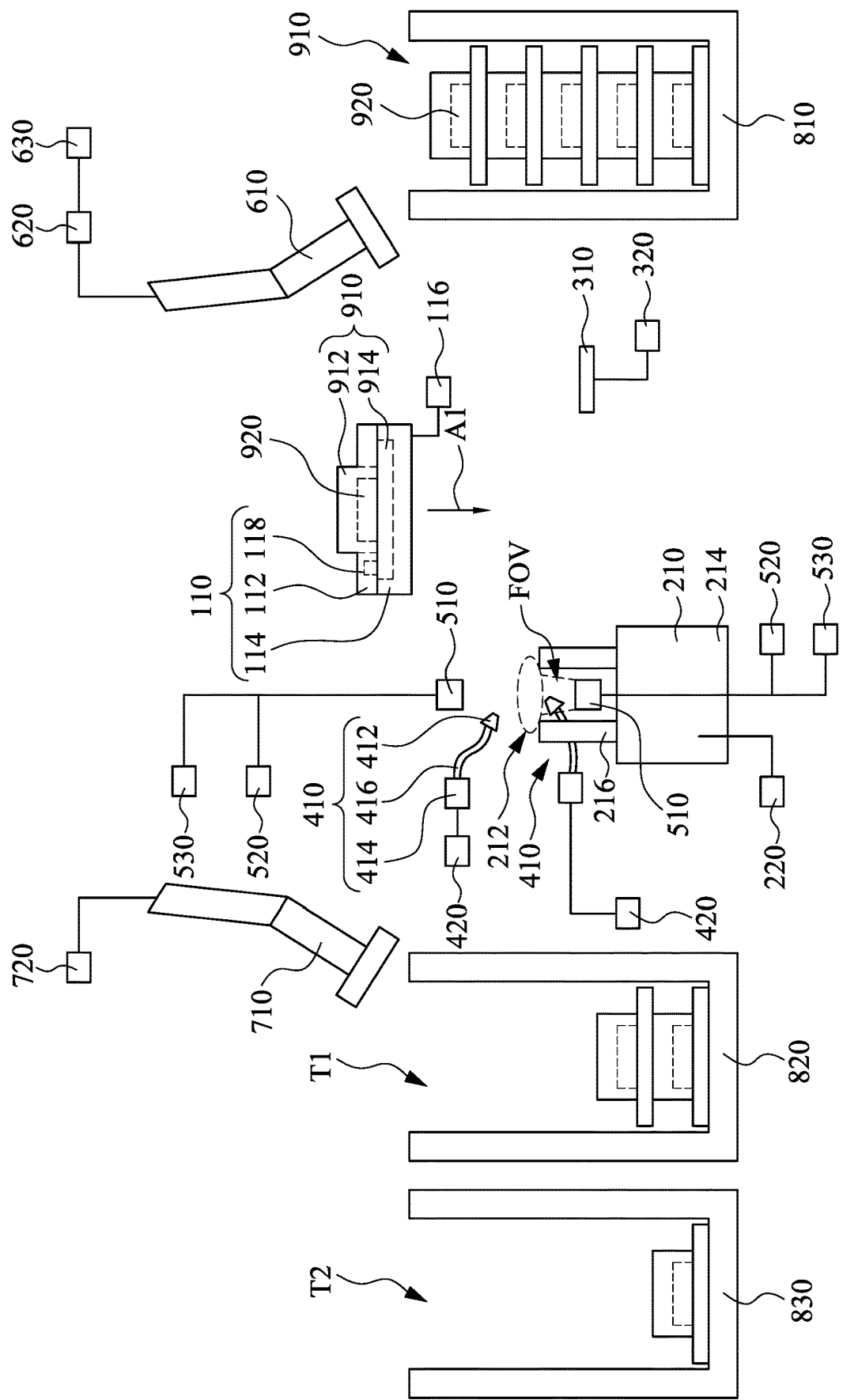

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Automated material handling system (AMHS) used in the semiconductor fabrication field includes a plurality of bays (rows) of storage areas. Each bay has a stocker, which includes bins for holding a plurality of containers, such as standard mechanical interface (SMIF) containers for loading 200 mm (8 inch) wafers, or front opening unified pods (FOUPs), which may be used to load 300 mm (12 inch) wafers. The stocker holds the SMIFs or FOUPs in preparation for transporting a SMIF or FOUP to the load port of a processing tool. In technologies using larger critical dimensions (CD) and 200 mm wafers, a reticle stocker stores and delivers reticles for use in photolithographic processes. An overhead hoist transport (OHT) associated with each bay transports the SMIF or FOUP with wafers, or the pod with a reticle, from the respective stocker to a load port for processing in one of the tools (fabrication process machines). In technologies using reticles with larger CDs, each reticle can be covered with a pellicle. The pellicle may be a thin film of polymer secured to the reticle to prevent dirt from collecting directly on the reticle. The pellicle may keep foreign particles outside of the focal plane of the photolithographic tool used for patterning the wafer. However, some foreign particles may damage the pellicle or even the reticle. Therefore, embodiments of the present disclosure provide automated inspection and purging for the reticle.

FIG. 1 to FIG. 7 illustrate a reticle purging method at various stages in accordance with some embodiments. In some embodiments, a reticle purging system includes an automated pod opener 110, a reticle holding device 210, a reticle transporting device 310 and at least one purging device 410. A pod 910 that accommodates a reticle (or called photomask) 920 therein can be placed on the automated pod opener 110, and the automated pod opener 110 is a machine capable of automatedly opening the pod 910 to expose the reticle 920. The reticle holding device 210 has a reticle occupiable zone 212 thereon. In other words, there is a zone on the reticle holding device 210 that is capable of being occupied by the reticle 920, and such a zone can serve as the reticle occupiable zone 212. The reticle transporting device 310 is assigned with a transportation path from the automated pod opener 110 to the reticle occupiable zone 212 of the reticle holding device 210. For example, the reticle transporting device 310 may be a robot having an end effector capable of moving from the automated pod opener 110 to the reticle holding device 210, especially the reticle occupiable zone 212, so as to transport the reticle 920 from the automated pod opener 110 to the reticle holding device 210. The reticle occupiable zone 212 is exposed to the purging device 410, so that the purging device 410 can purge the reticle 920 that is transported to the reticle occupiable zone 212. Since the reticle purging system automatedly opens the pod 910, transports the reticle 920 and purges the reticle 920, manual operations for purging the reticle 920 can be omitted.

Figure 2:
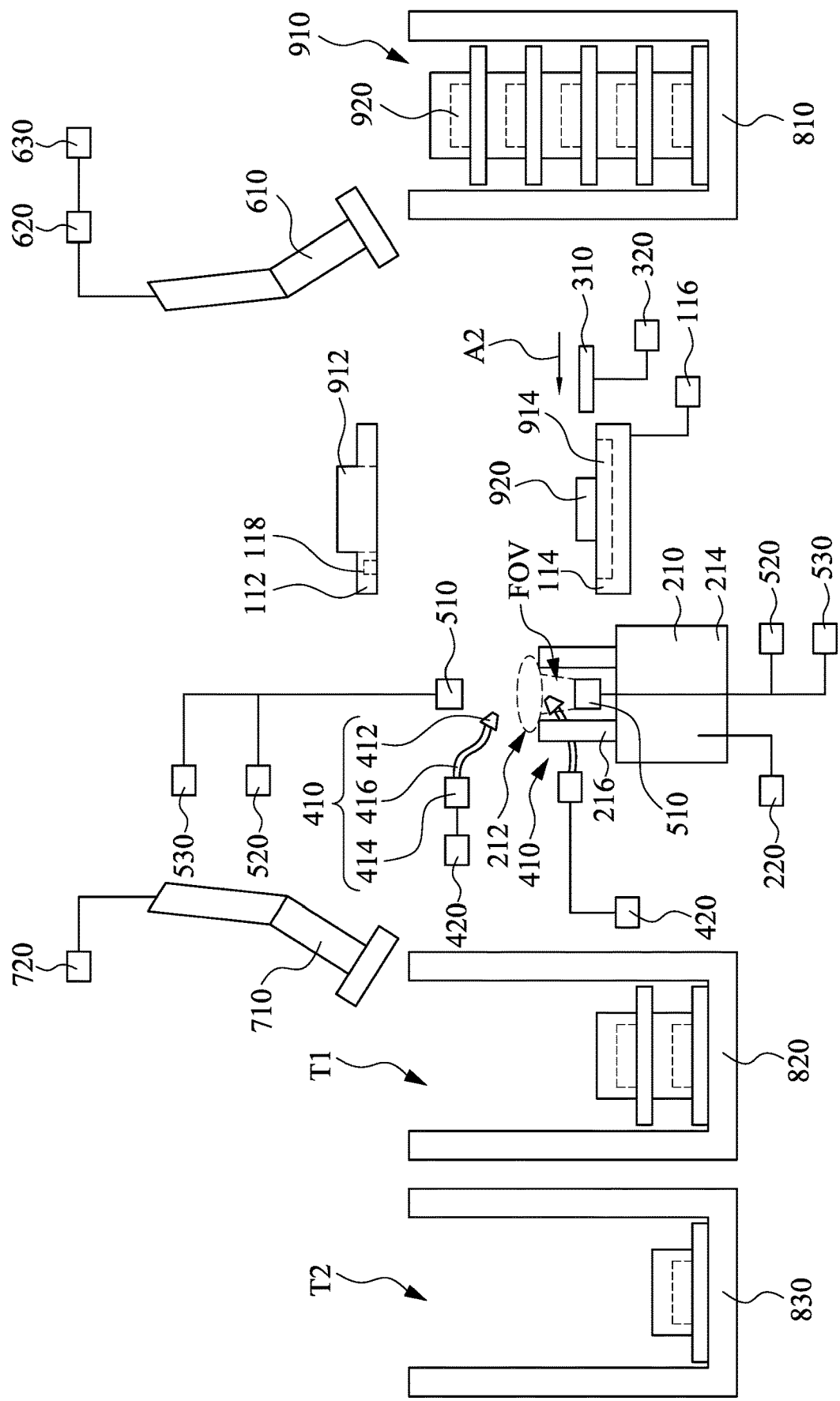

Reference can be made to FIG. 1 and FIG. 2, in which an automated pod opening process performed by the automated pod opener 100 is illustrated. In some embodiments, the automated pod opener 110 may include a lid holder 112, a base holder 114 and an actuator 116. The pod 910 includes a lid 912 and base 914. The lid 912 is placed on the base 914. The lid holder 112 is configured to hold the lid 912, and the base holder 114 is configured to hold the base 914. The actuator 116 is configured to actuate one of the lid holder 112 and the base holder 114 to move away from the other of the lid holder 112 and the base holder 114. For example, the base holder 114 may be movable with respect to the lid holder 112 by the actuator 116, and the lid holder 112 may be stationary. In particular, the actuator 116 may actuate the base holder 114 to move along a direction A1 away from the lid holder 112, so that the base 914 held by the base holder 114 can be separated or detached from the lid 912 held by the lid holder 112, as shown in FIG. 2. As such, the pod 910 can be opened to expose the reticle 920 placed on the base 914. In some other embodiments, the base holder 114 may be stationary, and the lid holder 112 may be movable with respect to the base holder 114 by the actuator 116, so that the pod 910 can be opened to expose the reticle 920 as well. In some other embodiments, the lid holder 112 and the base holder 114 are actuated by the actuator 116 to move away from each other. In some embodiments, the lid 912 may be secured to the base 914 via a latch (not shown) in the pod 910, and the automated pod opener 110 may include a disengaging mechanism 118 capable of disengaging the latch in the pod 910, so as to benefit separation for the lid 912 and the base 914. In some embodiments, a controller may be programmed to control the actuator 116 to perform the actuation to move at least one of the lid holder 112 and the base holder 114 after the disengaging process of the disengaging mechanism 118 is performed, so as to prevent from damage to the pod 910. In other words, the disengaging mechanism 118 may unlock the pod 910 to make the lid 912 and the base 914 separable or detachable, and then the actuator 116 may actuate at least one of the lid holder 112 and base holder 114 to move, so that the lid 912 and the base 914 can be separated to expose the reticle 920. In some embodiments, the lid holder 112 may hold the lid 912 using, for example, a mechanical force or a suction force. Similarly, in some embodiments, the base holder 114 may hold the base 914 using, for example, a mechanical force or a suction force.

In some embodiments, prior to the pod opening process, a pod loading process can be automatedly performed. For example, the reticle purging system may include a pod loading device 610, a pod loading actuator 620, a pod opener availability determiner 630 and a buffer storage 810. The pod loading device 610 may be a robotic arm that is assigned with a transportation path from the buffer storage 810 to the automated pod opener 110. The pod opener availability determiner 630 is configured to automatedly determine whether the automated pod opener 910 is available. For example, if there is a pod 910 on the automated pod opener 110, the pod opener availability determiner 630 can automatedly determine the automated pod opener 110 is unavailable temporarily. On the contrary, if there is no pod 910 on the automated pod opener 110, the pod opener availability determiner 630 can automatedly determine the automated pod opener 110 is available. The pod loading actuator 620 is configured to actuate the pod loading device 610 to move along the assigned transportation path based on a determination made by the pod opener availability determiner 630. For example, if the determination made by the pod opener availability determiner 630 is that the automated pod opener 110 is available, the pod loading device 610 may be actuated to transport the pod 910 from the buffer storage 810 to the automated pod opener 110. On the contrary, if the determination made by the pod opener availability determiner 630 is that the automated pod opener 110 is temporarily unavailable, the pod loading device 610 is not actuated, so that the pod 910 in the buffer storage 810 may remain therein and await automated pod opener 110 to become available. In some embodiments, the pod opener availability determiner 630 may be implemented by software or firmware.

Reference can be made to FIG. 2. When the pod 910 is opened to expose the reticle 920 on the base holder 114, the reticle transporting device 310 may be actuated to move the base holder 114 to hold the reticle 920, such as moving along a direction A2 shown in FIG. 2 to reach the reticle 920. In some embodiments, the reticle purging system may include a reticle loading actuator 320. The reticle loading actuator 320 is electrically connected to the reticle transporting device 310, so that the reticle loading actuator 320 can be configured to actuate the reticle transporting device 310 when at least one of the lid holder 112 and the base holder 114 is actuated. In other words, a controller may be programmed to control the actuation of the reticle transporting device 310 performed by the reticle loading actuator 320 after the actuation of the automated pod opener 110 performed by the actuator 116. In some embodiments, the reticle transporting device 310 may be actuated to hold the reticle 920 using, for example, a mechanical force or a suction force when the reticle transporting device 310 reaches the reticle 920.

Figure 3:
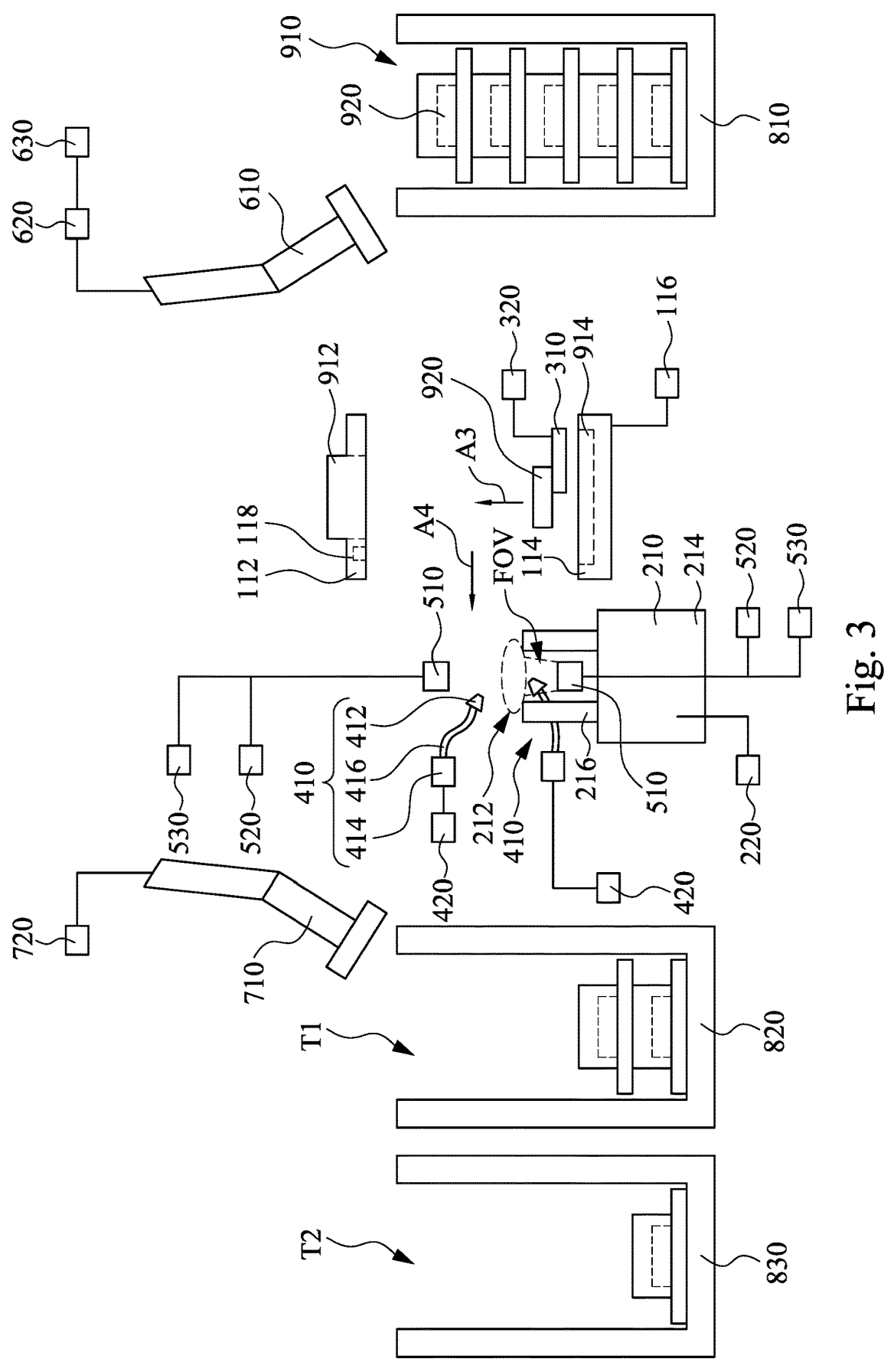
Figure 4:
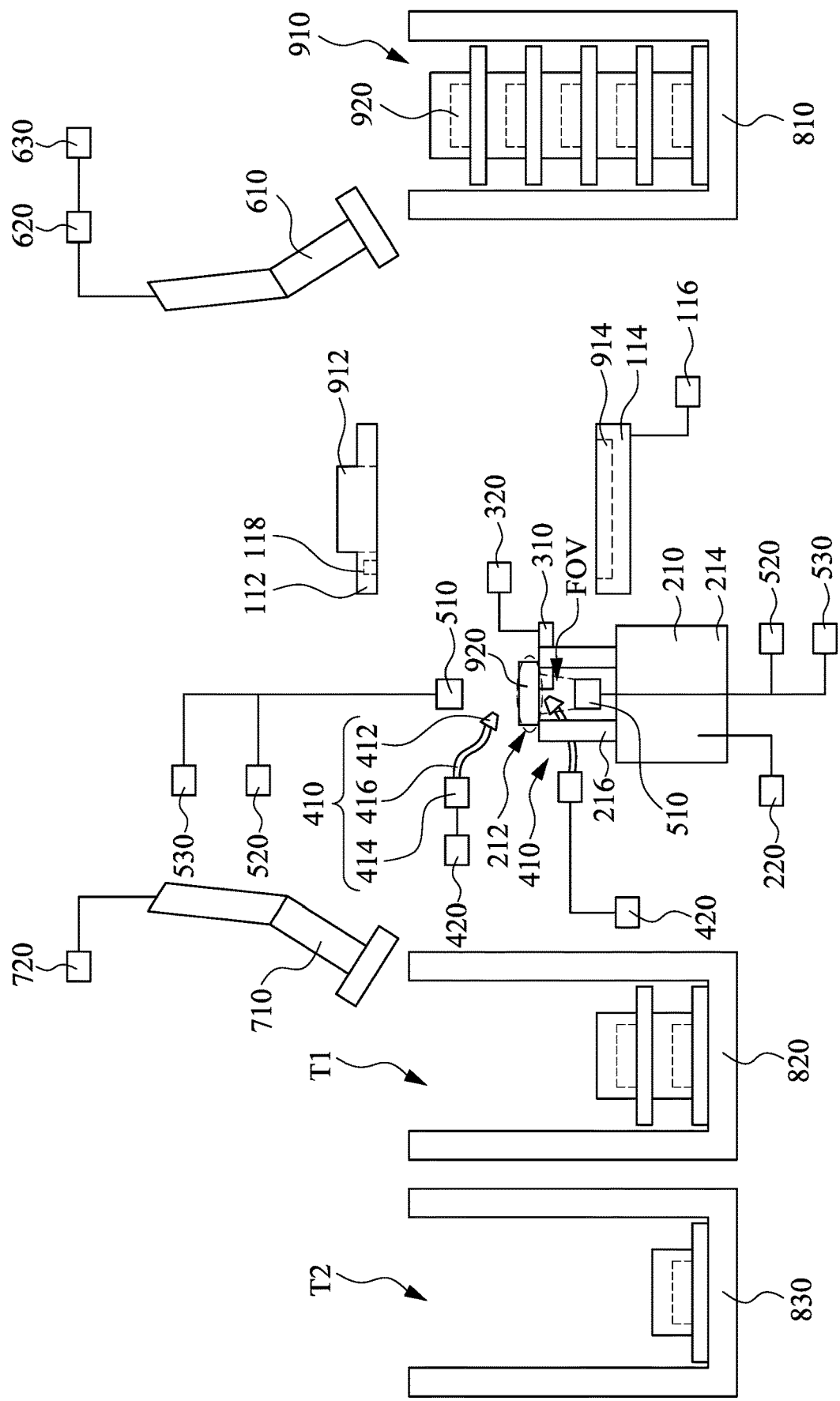

In FIG. 3 and FIG. 4, the reticle transporting device 310 assigned with the transportation path from the automated pod opener 110 to the reticle occupiable zone 212 of the reticle holding device 210 may be actuated to move along the transportation path, such as moving along directions A3 and A4 shown in FIG. 3, so that the reticle 920 held by the reticle transporting device 310 can be transported to the reticle holding device 210. The reticle holding device 210 may be actuated to hold the reticle 920 using, for example, a mechanical force or a suction force when the reticle 920 arrives at the reticle occupiable zone 212 by the reticle transporting device 310. For example, the reticle purging system may include a reticle holding actuator 220. The reticle holding actuator 220 is configured to actuate the reticle holding device 210 to exert, for example, a suction force to the reticle occupiable zone 212 when the reticle transporting device 310 arrives at the reticle occupiable zone 212. In other words, a controller may be programmed to control the actuation of the reticle holding device 210 performed by the actuator 220 after the reticle transporting device 310 arrives at the destination of the assigned transportation path. In some embodiments, the transportation path can be predetermined or stored in a controller, such as a programmable logic controller, which controls the movement of the reticle transporting device 310.

In FIG. 4, when the reticle 920 is held by the reticle holding device 210, the purging device 410 can be actuated to purge the reticle 920 based on an image of the reticle 920. For example, the reticle purging system may include an image capturing device 510 and a purging actuator 420. The reticle occupiable zone 212 is exposed to the image capturing device 510. In a greater detail, the image capturing device 510 has a field of view FOV that overlaps the reticle occupiable zone 212, so that the reticle 920 may be located within the field of view FOV of the image capturing device 510 when the reticle 920 is transported to the reticle occupiable zone 212 by the reticle transporting device 310. Therefore, the image capturing device 510 can capture an image of the reticle 920 when the reticle 920 is located on the reticle occupiable zone 212, which may benefit automated inspection of the reticle 920. The purging actuator 420 is configured to actuate the purging device 410 based on the image captured by the image capturing device 510. In other words, the purging device 410 can be actuated to purge the reticle 920 based on a captured image of the reticle 920. For example, the reticle purging system may include a purging determiner 520. The purging determiner 520 is electrically connected to the image capturing device 510, so that the purging determiner 520 can receive the captured reticle image from the image capturing device 510. The purging determiner 520 is configured to automatedly determine an execution of a purging process, which can be performed by the purging device 410, based on the captured reticle image. In other words, the purging determiner 520 can make a determination of whether the reticle 920 can be purged based on the captured reticle image. The purging actuator 420 is electrically connected to the purging determiner 520, so that the purging actuator 420 can actuate the purging device 410 based on a determination made by the purging determiner 520. Therefore, the reticle 920 can be automatically inspected and purged by cooperation of the image capturing device 510, the purging determiner 520, the purging actuator 420 and the purging device 410, and hence manual operations for inspection and purge can be omitted. In some embodiments, the purging device 410 can be actuated without based on the determination made by the purging determiner 520. In other words, the purging device 410 can purge the reticle 920 on the reticle occupiable zone 212 without based on the image of the reticle 920. In such conditions, the image capturing device 510 and the purging determiner 520 may be omitted. In some embodiments, the purging determiner 520 can be implemented by software or firmware.

In some embodiments, a plurality of the image capturing devices 510 may be respectively present on opposite sides of the reticle occupiable zone 212, and a plurality of the purging devices 410 may be respectively present on opposite sides of the reticle occupiable zone 212 as well. For example, one image capturing device 510 is present on an upper side of the reticle occupiable zone 212, and the other image capturing device 510 is present on a lower side of the reticle occupiable zone 212. Similarly, one purging device 410 is located on the upper side of the reticle occupiable zone 212, and the other purging device 410 is located on the lower side of the reticle occupiable zone 212. In other words, the reticle occupiable zone 212 may be present between the image capturing devices 510 and the purging devices 410. By using such a configuration, upper and lower surfaces of the reticle 920 can be inspected and purged respectively and individually. More particularly, the upper image capturing device 510 has a field of view FOV that overlaps the upper side of the reticle occupiable zone 212, so that the upper image capturing device 510 can capture an image of the upper surface of the reticle 920 when the reticle 920 is located on the reticle occupiable zone 212, which may benefit automated inspection of the upper surface of the reticle 920. Similarly, the lower image capturing device 510 has a field of view FOV that overlaps the lower side of the reticle occupiable zone 212, so that the lower image capturing device 510 can capture an image of the lower surface of the reticle 920 when the reticle 920 is located on the reticle occupiable zone 212, which may benefit automated inspection of the lower surface of the reticle 920. The upper purging device 410 may be actuated based on the image captured by the upper image capturing device 510, and the lower purging device 410 may be actuated based on the image captured by the lower image capturing device 510, so that the upper and lower purging devices 410 can be individually actuated. In some embodiments, the upper and lower purging devices 410 may be actuated by separated and individual purging actuators 420. In some other embodiments, the upper and lower purging devices 410 may be actuated by the same purging actuator 420. In some embodiments, separated purging determiners 520 are individually and respectively configured to automatedly determine executions of the purging processes of the upper and lower purging devices 410. In some other embodiments, the executions of the purging processes of the upper and lower purging devices 410 may be determined by the same purging determiner 520.

In some embodiments, the purging determiner 520 makes the determination of execution of the purging process based on, for example, whether a calculated amount of foreign particles in the captured reticle image exceeds a predetermined acceptable amount of foreign particles. More particularly, the purging determiner 520 can store the predetermined acceptable amount of foreign particles, and the purging determiner 520 can automatedly calculate an amount of the foreign particles in the image captured by the image capturing device 510 and can automatedly determine to execute the purging process when the calculated amount of the foreign particles exceeds the predetermined acceptable amount. On the contrary, the purging determiner 520 can automatedly determine to not execute the purging process when the calculated amount of the foreign particles does not exceed the predetermined acceptable amount.

In some embodiments, the image capturing device 510 may include, but is not limited to, a charge-coupled device (CCD) camera or a complementary metal-oxide-semiconductor (CMOS) camera. Multiple illumination levels, imaging wavelengths, darkfield and brightfield, reflection and transmission levels, polarization states, focal planes, phase contrast, diffractive interference contrast (DIC), or any combination may be used to achieve greater contrast and improve accuracy of the determination made by the purging determiner 520. These microscope illumination and imaging parameters may be varied to enhance the contrast of the foreign particles relative to the reticle 920 in the captured image. In some embodiments, the image capturing device 510 and the reticle occupiable zone 212 are movable with respect to each other, so that the field of view FOV of the image capturing device 510 can overlap different portions of the reticle occupiable zone 212 when the field of view FOV does not cover the whole reticle occupiable zone 212. The moving and image capturing process may be also referred to as an image scanning process. In some embodiments, image capturing performed by the image capturing device 510 may be synchronized with stopping of the movement of reticle occupiable zone 212, the image capturing device 510 or combinations of them. In some embodiments, the image capturing device 510 is movable with respect to the reticle holding device 210, and the reticle holding device 210 is stationary. In some other embodiments, the image capturing device 510 is stationary, and the reticle holding device 210 is movable with respect to the image capturing device 510. In still some other embodiments, when the field of view FOV of the image capturing device 510 covers the whole reticle occupiable zone 212, the image capturing device 510 and the reticle holding device 210 may be stationary with respect to each other. In some embodiments, a light source (not shown) may be employed to illuminate the reticle occupiable zone 212 such that the image capturing device 510 may capture a brighter image, which may improve accuracy of the determination made by the purging determiner 520.

In some embodiments, the purging device 410 includes a gas exit 412 and a gas source 414. The gas exit 412 is exposed to the reticle occupiable zone 212. The gas source 414 is in gas communication with the gas exit 412. As such, gas from the gas source 414 may be provided to the reticle occupiable zone 212 through the gas exit 412, so that the reticle 920 occupying the reticle occupiable zone 212 can be purged by the gas. The gas source 414 may be a source of pressurized or compressed nitrogen gas or other suitable gas, such as inert gas, so as to prevent from the chemical reaction with the reticle 920. In some embodiments, the purging device 400 may further include a flexible conduit 416. The flexible conduit 416 is connected between the gas exit 412 and the gas source 414. In other words, the flexible conduit 416 is in gas communication between the gas source 414 and the gas exit 412, so that the gas from the gas source 414 may be provided to gas exit 412 through the flexible conduit 416. For example, the flexible conduit 416 may extend from an output port (not labeled) of the gas source 414, and the gas exit 412 may be located on an end of the flexible conduit 416 distal to the gas source 414. Since the conduit 416 is flexible, the gas exit 412 may be adjusted to a location suitable for the purging process by bending the flexible conduit 416. In some embodiments, the flexible conduit 416 is substantially airtight, so as to prevent from leakage of the gas flowing in the flexible conduit 416. In some embodiments, the flexible conduit 416 may be fitted with a valve (not shown) for regulating flow of gas from the gas source 414 through the flexible conduit 416.

In some embodiments, the reticle holding device 210 may hold the reticle 920 occupying the reticle occupiable zone 212 using, for example, a mechanical force or a suction force. For example, in some embodiments, the reticle holding device 210 may include a negative pressure source 214 and a plurality of hollow structures 216. The hollow structures 216 each may has a chamber (not labeled) therein, and the chambers of the hollow structures 216 may be in gas communication with the negative pressure source 214, so that the negative pressure source 214 can generate negative pressure in the chambers of the hollow structures 216 to produce suction forces to hold the reticle 920. Therefore, even if the reticle 920 is blown by the pressurized gas from the purging device 400, the reticle holding device 210 can securely hold the reticle 920.

Figure 5:
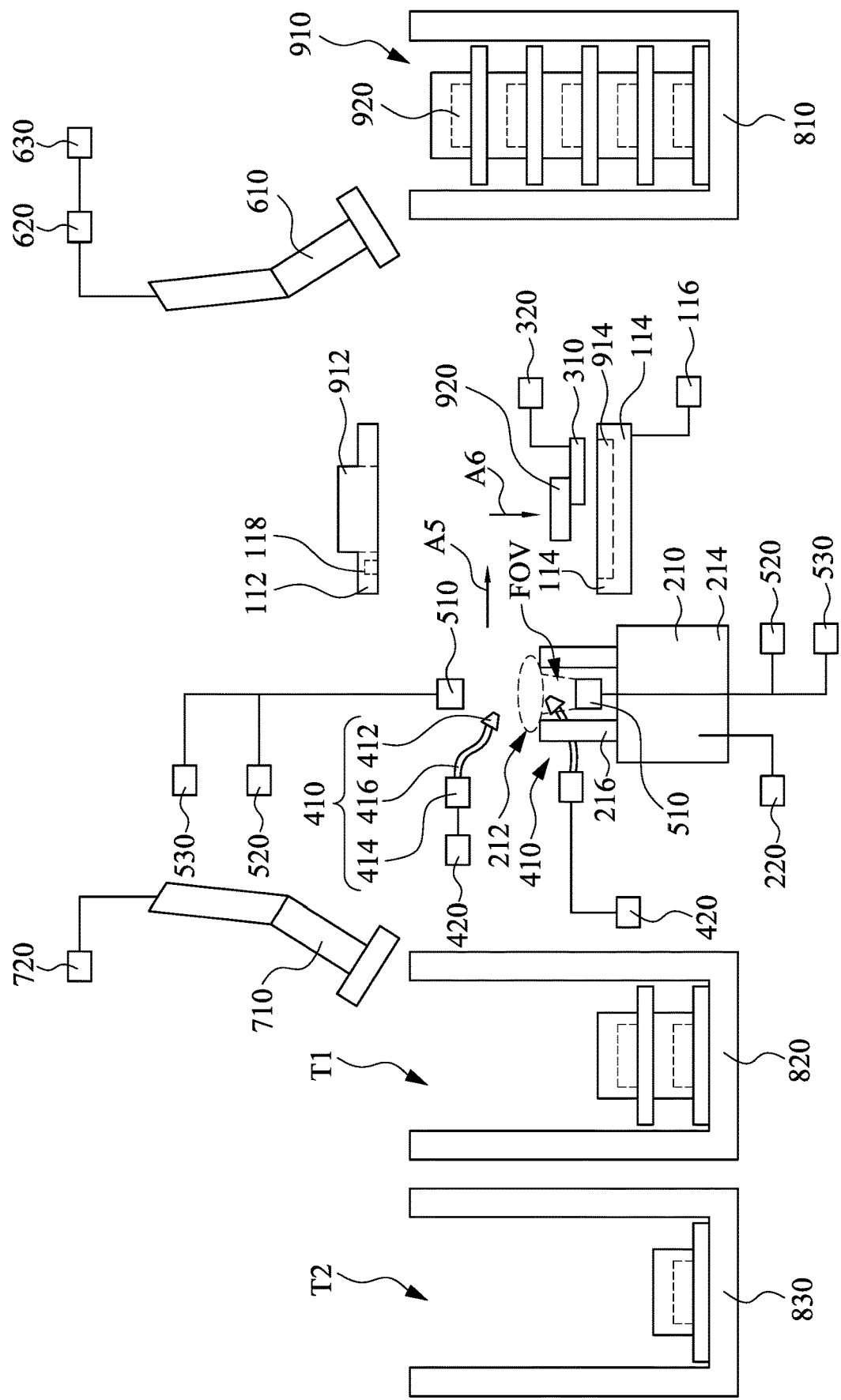
Figure 6:
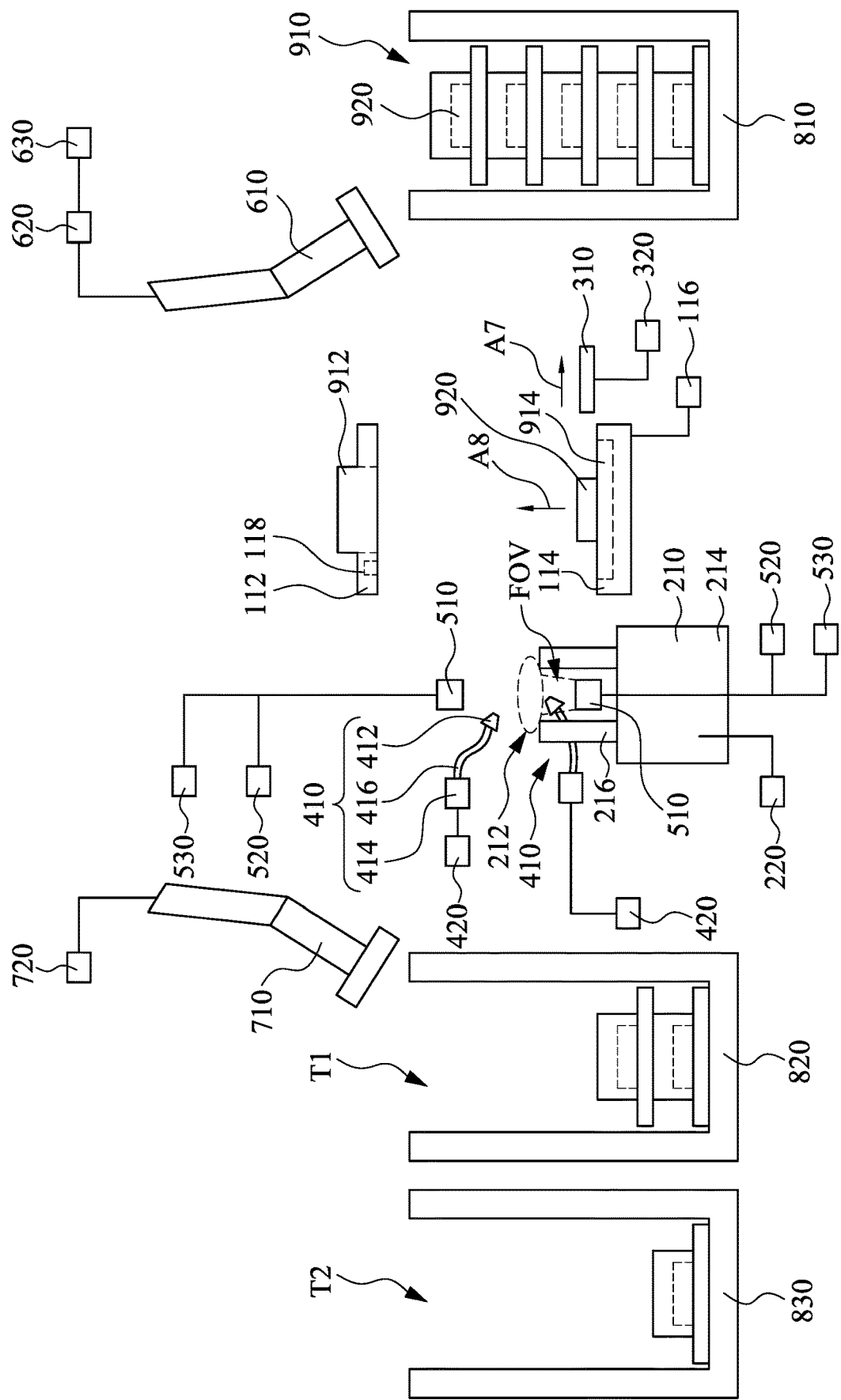
Figure 7:
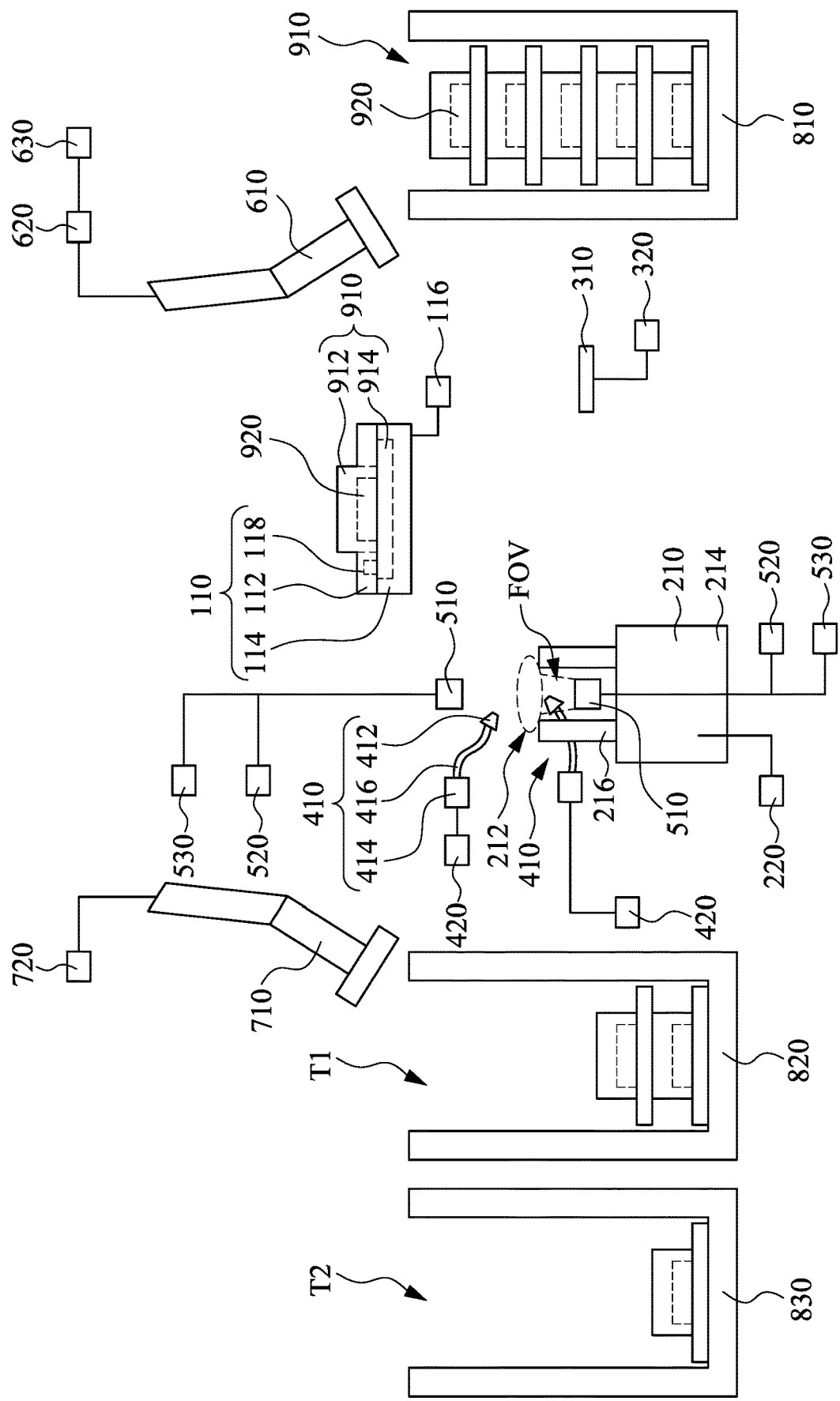

After the automated inspection and purge process, the reticle holding device 210 may be controlled to stop holding the reticle 920. Thereafter, in some embodiments, the purged reticle 920 can be transported back to the pod 910, as shown in FIGS. 5-7. In some other embodiments, the purged reticle 920 can be transported to another container, instead of the pod 910. In the embodiments that the reticle 920 is transported back to the pod 910, the reticle transporting device 310 may be actuated to hold the reticle 920 and to move along a reverse direction of the assigned transportation path, such as moving along directions A5 and A6 shown in FIG. 5, so that the reticle 920 can be transported back to the base 914 of the pod 910 held by the base holder 114. Afterwards, the reticle transporting device 310 may be actuated to move away from the base holder 114, such as moving along a direction A7 shown in FIG. 6. Afterwards, the actuator 116 of the automated pod opener 110 may actuate the base holder 114 to move toward the lid holder 112, such as moving along a direction A8 shown in FIG. 6, so that the base 914 can be transported to the lid 912 to close the pod 910, and the automatedly inspected and purged reticle 920 may be accommodated back in the closed pod 910, as shown in FIG. 7. In some embodiments, the transportation of the inspected and purged reticle 920 from the reticle occupiable zone 212 to the base holder 114 may be performed by another transportation device, instead of the original reticle transporting device 310. In other words, there may be multiple end effectors respectively transporting the unpurged reticle 920 to the reticle occupiable zone 212 and transporting the purged reticle 920 from the reticle occupiable zone 212.

In some embodiments, the reticle purging system may include a reticle classifying unit 530, an unloading device 710 and an unloading actuator 720. The reticle classifying unit 530 is electrically connected to the image capturing device 510, so that the reticle classifying unit 530 can receive the reticle image captured by the image capturing device 510. The reticle classifying unit 530 is configured to automatedly make a classification result based on the reticle image captured by the image capturing device 510. In a greater detail, the reticle 920 can be categorized as an acceptable type (Ok type) or an unacceptable type (NG type) by the reticle classifying unit 530. The unloading device 710 may be a robotic arm assigned with different transportation destinations T1 and T2 that respectively correspond to the acceptable type reticle and the unacceptable type reticle. The unloading actuator 720 is configured to actuate the unloading device 710 to move to one of the transportation destinations T1 and T2 based on the classification result made by the reticle classifying unit 530. For example, when the classification result of the reticle 920 made by the reticle classifying unit 530 is the acceptable type, the unloading device 710 may be actuated to transport a container, such as the pod 910, accommodating the acceptable reticle 920 to the transportation destination T1. On the contrary, when the classification result of the reticle 920 made by the reticle classifying unit 530 is the unacceptable type, the unloading device 710 may be actuated to transport a container, such as the pod 910, accommodating the unacceptable reticle 920 to the transportation destination T2. Therefore, automated classification or categorization for the reticles 920 may be achieved. In some embodiments, the reticle classifying unit 530 may be implemented by software or firmware.

In some embodiments, a controller may be programmed to control perform the categorization process or classification process of the reticle classifying unit 530 after the automated inspection and purge process. More particularly, after the reticle 920 is purged, the image capturing device 510 may recapture an image of the reticle occupiable zone 212, so that the image of the purged reticle 920 can be captured. Afterwards, the reticle classifying unit 530 may automatedly recognize a defect in the image of the purged reticle 920. When the recognized defect is worse than a predetermined defect stored in the reticle classifying unit 530, the reticle classifying unit 530 may categorize the purged reticle 920 as the unacceptable type. On the contrary, when the recognized defect is not worse than the predetermined defect stored in the reticle classifying unit 530, the reticle classifying unit 530 may categorize the purged reticle 920 as the acceptable type.

In some embodiments, the reticle purging system includes a plurality of reticle cabinets 820 and 830. The transportation destinations T1 and T2 that respectively correspond to the acceptable and unacceptable reticles 920 are respectively located in the reticle cabinets 820 and 830. Therefore, the acceptable reticles 920 may be transported to the reticle cabinet 820, and the unacceptable reticles 920 may be transported to the reticle cabinet 830. As such, manual categorization for the reticles 920 can be omitted.

In the aforementioned embodiments, the automated pod opener is capable of automatedly opening a pod, and a reticle transporting device is capable of automatedly transporting the reticle in the opened pod to a reticle occupiable zone on a reticle holding device, and the purging device is capable of automatedly purging the reticle on the reticle occupiable zone. Therefore, automated purging process can be implemented, so that manual operations for the purging process can be reduced or omitted.

According to some embodiments, a reticle purging system includes an automated pod opener, a reticle holding device, a reticle transporting device and at least one purging device. The reticle holding device has a reticle occupiable zone thereon. The reticle transporting device is assigned with a transportation path from the automated pod opener to the reticle holding device. The reticle occupiable zone is exposed to the purging device.

According to some embodiments, a reticle purging system includes an automated pod opener, a reticle holding device, a reticle transporting device, an image capturing device, a purging device and a purging actuator. The reticle holding device has a reticle occupiable zone thereon. The reticle transporting device is assigned with a transportation path from the automated pod opener to the reticle holding device. The reticle occupiable zone is exposed to the image capturing device. The purging actuator is configured to actuate the purging device based on an image captured by the image capturing device.

According to some embodiments, a reticle purging method includes automatedly opening a pod having a reticle therein, moving the reticle from the pod onto a reticle holding device, capturing an image of the reticle on the reticle holding device by an image capturing device, and purging the reticle based on the image captured by the image capturing device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reticle purging system, comprising:
   an automated pod opener;
   a reticle holding device having a reticle occupiable zone configured to support a reticle thereon;
   a reticle transporting device assigned with a transportation path from the automated pod opener to the reticle occupiable zone, wherein the reticle holding device is independent from movement of the reticle transporting device; and
   at least one purging device to which the reticle occupiable zone is exposed, wherein the at least one purging device has a gas exit configured to be disposed under the reticle when the reticle is supported by the reticle holding device in the reticle occupiable zone.

2. The reticle purging system of claim 1, further comprising:
   at least one image capturing device having a field of view covering the reticle occupiable zone;
   a reticle classifying unit configured to make a classification result based on an image captured by the image capturing device;
   an unloading device assigned with different transportation destinations; and
   an unloading actuator configured to actuate the unloading device to move to one of the transportation destinations based on the classification result.

3. The reticle purging system of claim 2, further comprising:
   a plurality of reticle cabinets, wherein the transportation destinations assigned to the unloading device are respectively located in the reticle cabinets.

4. The reticle purging system of claim 1, wherein the purging device comprises:
   a gas exit exposed to the reticle occupiable zone; and
   a gas source in gas communication with the gas exit.

5. The reticle purging system of claim 4, wherein the purging device further comprises:
   a flexible conduit connected between the gas exit and the gas source.

6. The reticle purging system of claim 1, wherein a plurality of the purging devices each have a gas exit, and the reticle occupiable zone is located between the gas exits of the purging devices.

7. The reticle purging system of claim 1, further comprising:
   a buffer storage;
   a pod loading device assigned with a transportation path from the buffer storage to the automated pod opener;
   a pod opener availability determiner configured to automatedly determine whether the automated pod opener is available; and
   a pod loading actuator configured to actuate the pod loading device to move along the transportation path based on a determination made by the pod opener availability determiner.

8. The reticle purging system of claim 1, further comprising:
   an image capturing device configured to be disposed above the reticle.

9. The reticle purging system of claim 1, further comprising:
   a pair of image capturing devices configured to be respectively disposed above and under the reticle.

10. A reticle purging system, comprising:
    an automated pod opener;
    a reticle holding device having a reticle occupiable zone configured to support a reticle thereon;
    a reticle transporting device assigned with a transportation path from the automated pod opener to the reticle holding device, wherein the reticle holding device is independent from movement of the reticle transporting device;
    an image capturing device to which the reticle occupiable zone is exposed;
    a purging device having a gas exit configured to be disposed under the reticle when the reticle is supported by the reticle holding device in the reticle occupiable zone; and
    a purging actuator configured to actuate the purging device based on an image captured by the image capturing device.

11. The reticle purging system of claim 10, wherein the automated pod opener comprises:
    a lid holder;
    a base holder; and
    an actuator configured to actuate one of the lid holder and the base holder to move away from the other of the lid holder and the base holder.

12. The reticle purging system of claim 11, further comprising:
    a reticle loading actuator configured to actuate the reticle transporting device when at least one of the base holder and the lid holder is actuated.

13. The reticle purging system of claim 10, further comprising:
    a purging determiner configured to automatedly determine an execution of a purging process based on the image captured by the image capturing device, wherein the purging actuator is configured to actuate the purging device based on a determination made by the purging determiner.

14. The reticle purging system of claim 10, further comprising:

a reticle classifying unit configured to automatically make a classification result based on an image captured by the image capturing device after the purging device is actuated;

an unloading device assigned with different transportation destinations; and an unloading actuator configured to actuate the unloading device to move to one of the transportation destinations based on the classification result.

15. A reticle purging system, comprising:

a reticle holding device having a reticle occupiable zone configured to support a reticle thereon;

an image capturing device having a field of view overlapping the reticle occupiable zone of the reticle holding device;

a purging device whereto the reticle occupiable zone of the reticle holding device is exposed, wherein the purging device has a gas exit in the field of view of the image capturing device and configured to be disposed under the reticle when the reticle is supported by the reticle holding device in the reticle occupiable zone;

a purging actuator configured to actuate the purging device; and a reticle classifying unit configured to make a classification result based on a post-purging image captured by the image capturing device after the purging device is actuated by the purging actuator.

16. The reticle purging system of claim 15, further comprising:

an unloading device assigned with different transportation destinations, wherein each of the transportation destinations is a destination whereat a reticle is to be unloaded; and an unloading actuator configured to actuate the unloading device to move to either of the transportation destinations in response to the classification result.

17. The reticle purging system of claim 15, wherein the purging actuator is configured to actuate the purging device based on a pre-purging image captured by the image capturing device.

18. The reticle purging system of claim 17, further comprising:

a purging determiner configured to automatedly determine an execution of a purging process based on the pre-purging image, wherein the purging actuator is configured to actuate the purging device based on a determination made by the purging determiner.

19. The reticle purging system of claim 18, wherein the purging determiner is configured to make the determination based on whether a calculated amount of foreign particles in the pre-purging image exceeds a predetermined amount of foreign particles.

20. The reticle purging system of claim 15, wherein the purging device is configured to be disposed under and above the reticle.

* * * * *